United States Patent
Bauder et al.

(10) Patent No.: US 6,853,246 B2
(45) Date of Patent: Feb. 8, 2005

(54) ADAPTIVE PREDISTORTION SYSTEM AND A METHOD OF ADAPTIVELY PREDISTORTING A SIGNAL

(75) Inventors: Ruediger Bauder, Otterfing (DE); Young M. Kim, Breinigsville, PA (US); Qing Yan, Allentown, PA (US); Jeffrey L. Yiin, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/124,837

(22) Filed: Apr. 18, 2002

(65) Prior Publication Data

US 2003/0197558 A1 Oct. 23, 2003

(51) Int. Cl.$^7$ .............................................. H03F 1/26
(52) U.S. Cl. ....................... 330/149; 330/136; 375/297
(58) Field of Search .......................... 330/2, 136, 149; 375/296, 297; 455/63, 126

(56) References Cited

U.S. PATENT DOCUMENTS

| | | | | |
|---|---|---|---|---|
| 5,892,397 A | * | 4/1999 | Belcher et al. | 330/149 |
| 6,141,390 A | * | 10/2000 | Cova | 375/297 |
| 6,240,278 B1 | * | 5/2001 | Midya et al. | 330/149 |
| 6,246,286 B1 | * | 6/2001 | Persson | 330/149 |
| 6,314,142 B1 | * | 11/2001 | Perthold et al. | 375/296 |
| 6,373,902 B1 | * | 4/2002 | Park et al. | 375/296 |
| 6,400,774 B1 | * | 6/2002 | Matsuoka et al. | 375/295 |
| 6,462,617 B1 | * | 10/2002 | Kim | 330/149 |
| 6,512,417 B2 | * | 1/2003 | Booth et al. | 330/149 |
| 6,587,514 B1 | * | 7/2003 | Wright et al. | 375/296 |

OTHER PUBLICATIONS

U.S. Appl. No. 09/911,139 entitled "Digital Predistortion Technique for WCDMA Wireless Communication System and Method of Operation Thereof" filed Jul. 23, 2001.
"Minimum Distortion Power Polynomial Model (MDP–PM) of Nonlinear Power Amplifiers and Its Application on Analog Predistorters" by Haobo Lai and Y. Bar–Ness; (4 pages): VTC 99 Fall; Sep. 1999.

* cited by examiner

Primary Examiner—Khanh V. Nguyen

(57) ABSTRACT

An adaptive predistortion system for use with a power amplifier having a nonlinear amplification characteristic and a method of adaptively predistorting a signal is provided. In one embodiment, the adaptive predistortion system includes a coefficient update subsystem coupled to an output of the power amplifier and configured to update a set of predistortion coefficients using an iterative process based on an output signal of the power amplifier. Additionally, the adaptive predistortion system includes a predistortion filter subsystem coupled to the coefficient update subsystem and configured to employ the set of predistortion coefficients to reduce a level of distortion associated with the nonlinear amplification characteristic.

21 Claims, 3 Drawing Sheets

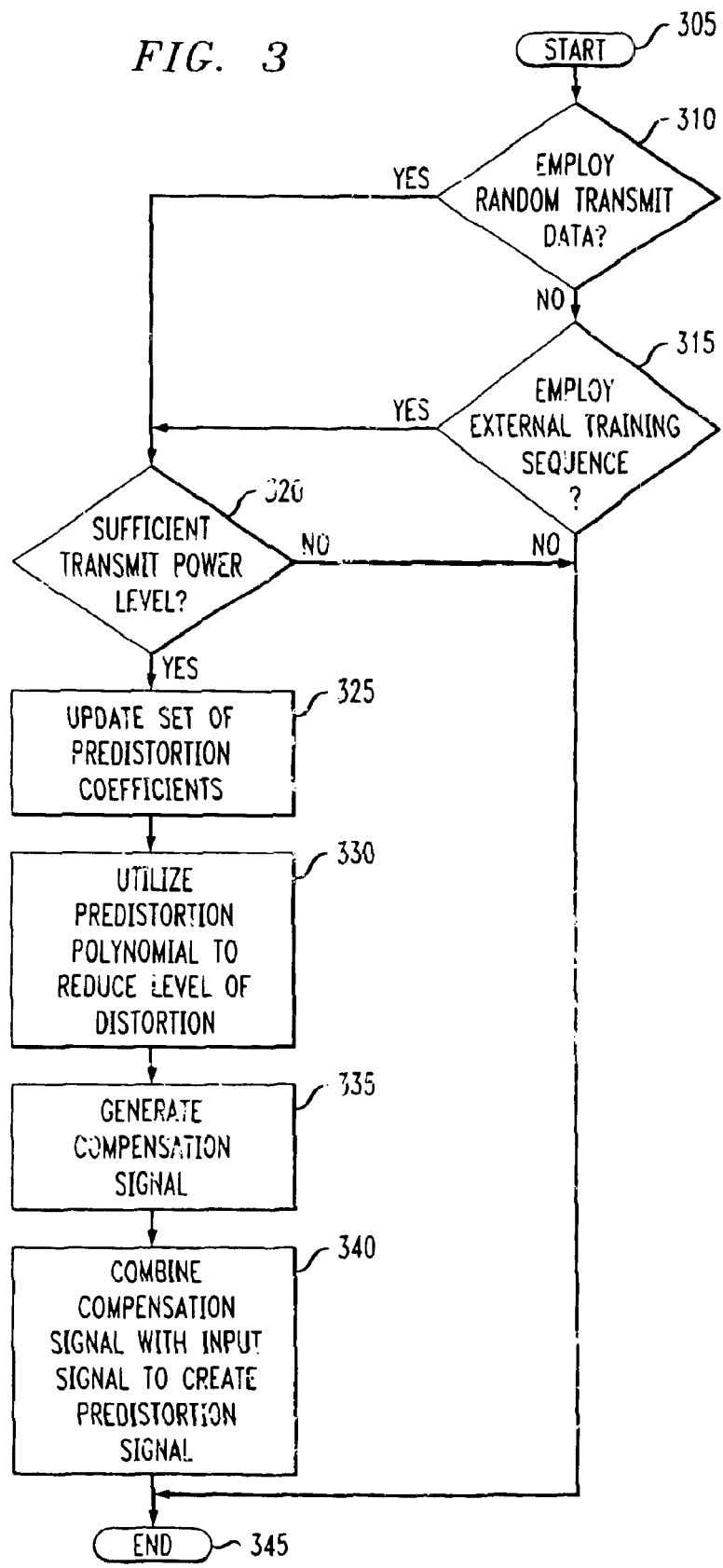

ADAPTIVE PREDISTORTION SYSTEM AND A METHOD OF ADAPTIVELY PREDISTORTING A SIGNAL

TECHNICAL FIELD OF THE INVENTION

The present invention is directed, in general, to electronic circuits and, more specifically, to an adaptive predistortion system, a method of adaptively predistorting a signal and a transmitter employing the adaptive predistortion system and the method.

BACKGROUND OF THE INVENTION

As the number of users of wireless communication systems increases, the requirements on these systems for reliability and efficiency increase. Among other things, there are two conflicting requirements in designing a radio transmitter, especially when the envelope of the transmitted signal varies. These requirements are high linearity in the transmitter characteristics and high power efficiency. A power amplifier is one of the key components of the transmitter that determines the linearity and power efficiency of the transmitter. Usually, high power amplifier efficiency is obtained at the expense of reduced power amplifier linearity and vice versa.

In modern wireless communication systems, a spectrally efficient transmitted signal is preferable to support high data rate services using a given RF spectrum. If the transmitter characteristics are not linear enough, out-of-band emission can increase beyond the spectrum mask imposed by a standardization or regulatory body. Further, portable radio transceivers should be highly efficient in power consumption so as to provide extended operation time with a battery. A large portion of the total power available is consumed by the power amplifier. Therefore, it is important to use a power efficient power amplifier to conserve battery power. Linearization techniques may be considered as a possible solution to overcome tightened spectral mask requirements with acceptable power amplifier efficiency.

There are several well known approaches available for linearization of nonlinear power amplifier characteristics. These approaches may be referred to as feedforward, feedback, envelope elimination and restoration, and linear amplification with nonlinear components. The first two approaches are better suited for analog implementations.

In the feedforward methodology, a distorted power amplifier output is compared with an original power amplifier input signal, and a resulting error signal is subtracted in the analog domain. Feedforward can, in theory, eliminate the intermodulation distortion, but the key problem of this scheme is the need of an ideal gain and phase match between the two signal paths. A fine tuning of analog components is necessary, and the power consumed by any additional analog components may be substantial. The feedforward methodology is quite complex, and the total efficiency is drained due to losses in main-path delay, couplers, and auxiliary amplifiers.

In typical feedback methods, the power amplifier output signal is down-converted to baseband and compared with an original modulating signal. The resulting error signal modulates the carrier so that power amplifier output signal is substantially free of distortion. Among various feedback techniques, cartesian feedback has been proven to work for wideband applications, and polar modulation feedback is more suitable for narrowband systems. A problem with some of these feedback methods is that the feedback path operates in parallel with the transmitter at all times and the complexity of these schemes is also quite high. Further, these well known feedback methodologies can suffer from instabilities.

In the envelope elimination and restoration methodology, the modulated signal is decomposed into an envelope signal and a phase-modulated signal. The power amplifier is driven by just the phase-modulated signal while the envelope component controls a direct voltage supply and/or a direct current supply. In the linear amplification with nonlinear components methodology, the modulated signal is decomposed into two constant magnitude phase modulated signals, and the two components are summed after driving their respective power amplifiers. In general, the previously mentioned techniques complicate the design, require multiple fine adjustments, and become less effective as device characteristics change with temperature and output power.

Accordingly, what is needed in the art is a linearization technique that overcomes the limitations of the prior art and is adaptive to changing conditions.

SUMMARY OF THE INVENTION

To address the above-discussed deficiencies of the prior art, the present invention provides an adaptive predistortion system for use with a power amplifier having a nonlinear amplification characteristic. In one embodiment, the adaptive predistortion system includes a coefficient update subsystem coupled to an output of the power amplifier and configured to update a set of predistortion coefficients using an iterative process based on an output signal of the power amplifier. Additionally, the adaptive predistortion system includes a predistortion filter subsystem coupled to the coefficient update subsystem and configured to employ the set of predistortion coefficients to reduce a level of distortion associated with the nonlinear amplification characteristic.

In another aspect, the present invention provides a method of adaptively predistorting a signal for use with a power amplifier having a nonlinear amplification characteristic. The method includes updating a set of predistortion coefficients using an iterative process based on an output signal of the power amplifier. The method also includes employing the set of predistortion coefficients to reduce a level of distortion associated with the nonlinear amplification characteristic.

The present invention also provides, in yet another aspect, a transmitter that includes a feedforward section configured to receive an input signal and having a power amplifier with a nonlinear amplification characteristic that is configured to provide an output signal. The transmitter also includes a feedback section configured to employ the output signal for use with an adaptive predistortion system. The adaptive predistortion system includes a coefficient update subsystem coupled to an output of the power amplifier and configured to update a set of predistortion coefficients using an iterative process based on the output signal of the power amplifier. The adaptive predistortion system also includes a predistortion filter subsystem coupled to the coefficient update subsystem and configured to employ the set of predistortion coefficients to reduce a level of distortion associated with the nonlinear amplification characteristic.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 3 illustrates a flow diagram of an embodiment of a method of adaptively predistorting a signal constructed in accordance with the principles of the present invention.

DETAILED DESCRIPTION

Figure 1:
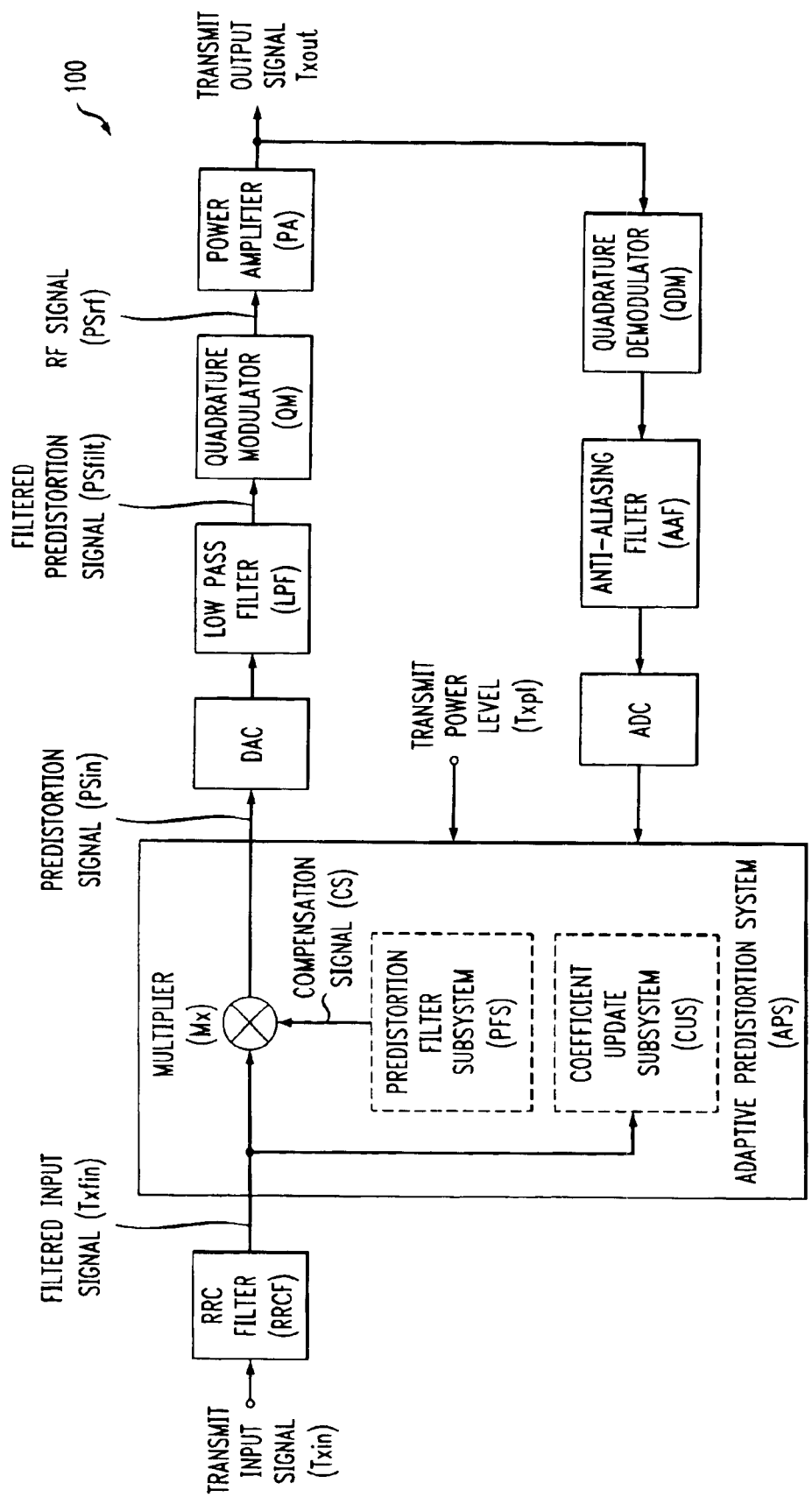
FIG. 1 illustrates a system diagram of an embodiment of a transmitter having an adaptive predistortion system constructed in accordance with the principles of the present invention.

Referring initially to FIG. 1, illustrated is a system diagram of an embodiment of a transmitter, generally designated 100, constructed in accordance with the principles of the present invention. The transmitter 100 receives a transmit input signal Txin and provides a transmit output signal Txout. Further, the transmitter 100 includes a feedforward section having a raised root cosine filter RRCF coupled to an adaptive predistortion system APS, a digital to analog converter DAC, a low pass filter LPF, a quadrature modulator QM and a power amplifier PA having a nonlinear amplification characteristic. The transmitter 100 also includes a feedback section having a quadrature demodulator QDM, an anti-alias filter AAF and an analog to digital converter ADC coupled to the adaptive predistortion system APS. In an alternative embodiment, the transmitter 100 may also include in-phase and quadrature-phase paths for implementing a complex baseband signal model.

The power amplifier PA produces an output signal that is not a linear function of its input signal due to its nonlinear amplification characteristic. This nonlinear amplification characteristic thereby causes distortion of the output signal. Predistortion may be a generally useful technique that may be employed to compensate for such a nonlinearity. A feedback path may be employed for tracking changes in an output parameter of the power amplifier PA that is associated with the nonlinear amplification characteristic. However, a dedicated feedback path may substantially increase the overall level of complexity.

One solution for overcoming the complexity of a dedicated feedback path is to take advantage of a compressed mode of protocol, such as a Universal Mobile Telecommunications System (UMTS) protocol. In the UMTS protocol, a transmission gap may be inserted periodically or on a requested basis during normal transmission. This transmission gap may then be employed by a receive channel associated with the transmitter 100 wherein the receive channel may then serve temporarily as the required feedback path. In one embodiment of the present invention, the transmitter 100 may use either a periodic or requested transmission gap as a temporary feedback path.

In the illustrated embodiment, the adaptive predistortion system APS includes a coefficient update subsystem CUS and a predistortion filter subsystem PFS. The coefficient update subsystem CUS is coupled to the output of the power amplifier PA and configured to update a set of predistortion coefficients using an iterative process based on an output signal of the power amplifier PA. The predistortion filter subsystem PFS is coupled to the coefficient update subsystem CUS and configured to employ the set of predistortion coefficients to reduce a level of distortion associated with the nonlinear amplification characteristic of the power amplifier PA.

In accordance with one aspect of the present invention, the adaptive predistortion system APS may include a multiplier Mx. The multiplier Mx may be configured to provide a predistortion signal PSin as a function of a compensation signal CS from the predistortion filter subsystem PFS and a filtered input signal Txfin. The raised root cosine filter RRCF is used in the transmitter 100 to filter and shape the transmit input signal Txin. Although the illustrated embodiment employs a raised root cosine filter RRCF, those skilled in the pertinent art should understand that any appropriate filter may be used. The predistortion signal PSin is employed to linearize the overall characteristics of the transmitter 100 resulting in a significant reduction of spectral regrowth or out-of-band emissions that would otherwise be associated with a more distorted transmit output signal Txout.

The predistortion signal PSin, produced by the adaptive predistortion system APS, is transformed from a digital signal to an analog signal by the digital to analog converter DAC. Once the predistortion signal PSin is in analog form, it is filtered by the lowpass filter LPF, which is constructed in an analog format. The analog lowpass filter LPF may be, for example, a Butterworth filter having an appropriate cutoff frequency and high frequency attenuation characteristic. Of course, other filter response characteristics having appropriate phase and attenuation characteristics may also be employed. The lowpass filter LPF provides a filtered predistortion signal PSfilt and generally acts as an antialiasing filter to remove aliasing images that may occur at integer multiples of an associated sampling frequency. The filtered predistortion signal PSfilt is provided to the quadrature modulator QM to generate an RF predistortion signal PSrf.

The power amplifier PA is then employed to increase the power of the RF signal PSrf thereby producing the transmit output signal Txout. The power amplifier PA may be operated near its saturation point to ensure higher operating efficiencies and therefore less wasted power. However, it is just this manner of operation that typically leads to the various nonlinearities in the transmit output signal Txout mentioned earlier. The adaptive predistortion system APS is used to compensate for and substantially remove such nonlinearities in the transmit output signal Txout.

In the illustrated embodiment, the transmitter 100 employs an associated receive channel as a temporarily feedback path to update a set of predistortion coefficients from the adaptive predistortion system APS. Updating these predistortion coefficients occurs on an iterative basis and their application is dependent on a transmit power level Txpl of the transmit output signal Txout. Updating these predistortion coefficients on an iterative basis adaptively allows distortions in the transmit output signal Txout to be substantially reduced over the case where the same predistortion coefficients are used for all values of transmit power levels Txpl.

The transmit output signal Txout is applied to the quadrature demodulator QDM to convert the RF signal PSrf back to a baseband signal. The quadrature demodulator QDM extracts incoming information and demodulates this feedback signal into a single, one-dimensional analog value. This demodulated analog signal is then applied to the anti-aliasing filter AAF, which employs a Butterworth response in this embodiment. Then the feedback signal is converted into a digital format by the analog to digital converter ADC, which is applied to the adaptive predistortion system APS. Since distortion in the power amplifier PA is a function of the magnitude of the transmit input signal Txin, the adaptive predistortion system APS may select predistortion coefficients based upon the transmit power level Txpl.

Figure 2:
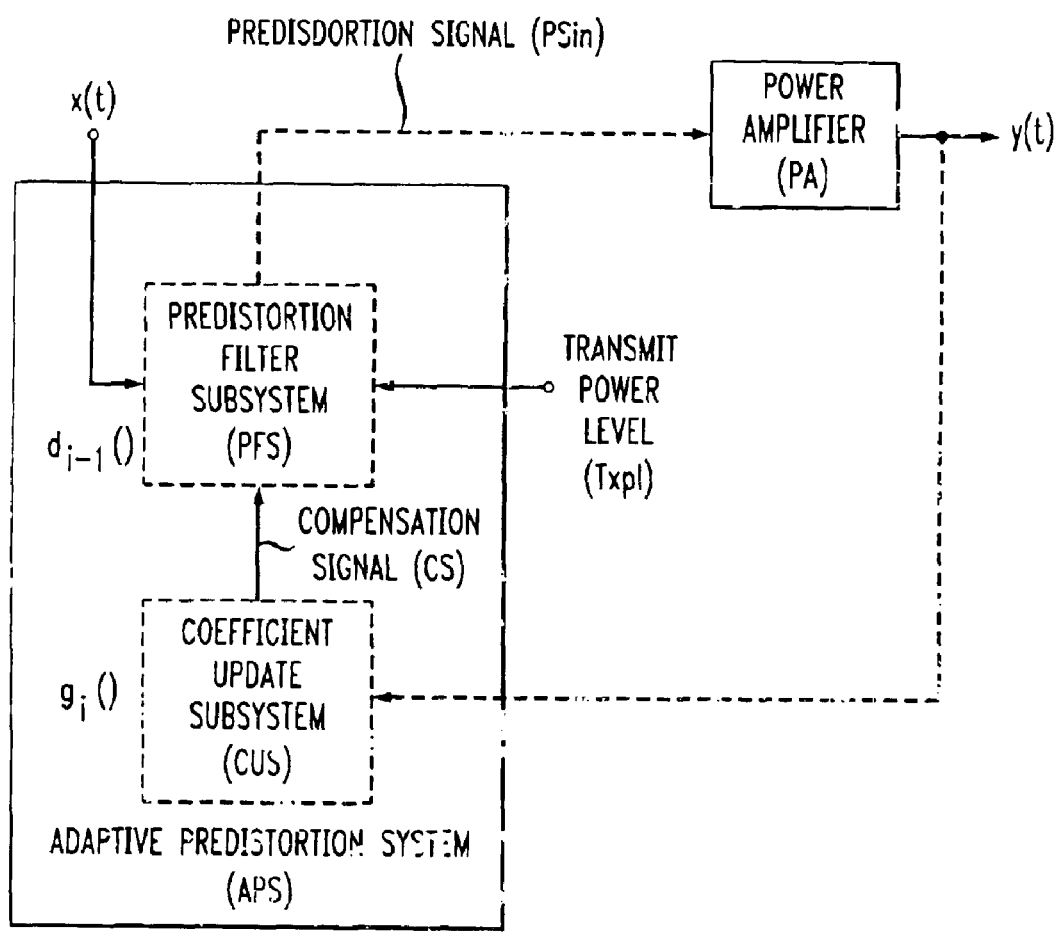
FIG. 2 illustrates a block diagram of an embodiment of an adaptive predistortion system constructed in accordance with the principles of the present invention.

Turning now to FIG. 2, illustrated is a block diagram of an embodiment of an adaptive predistortion system APS constructed in accordance with the principles of the present invention. The adaptive predistortion system APS includes a coefficient update subsystem CUS and a predistortion filter subsystem PFS. In the illustrated embodiment, the coefficient update subsystem CUS includes one or more processing elements which update a set of predistortion coefficients, utilize training data to determine a predistortion polynomial and utilize the predistortion polynomial to reduce the level of distortion in a transmitter. The predistortion filter subsystem PFS includes one or more processing elements which generate a compensation signal and combine the compensation signal with an input signal to create a predistortion signal PSin.

To approximate an appropriate amplification characteristic of a power amplifier PA, the adaptive predistortion system APS uses a model employing a polynomial (i.e., the predistortion polynomial) that employs a set of coefficients (i.e., the predistortion coefficients). To obtain an appropriate set of predistortion coefficients, in an exemplary embodiment, the inverse of the transfer function of the power amplifier PA may be obtained by using a training sequence.

In the co-pending and co-assigned patent application Ser. No. 09/911,139, entitled "Digital Predistortion Technique for WCDMA Wireless Communication System and Method of Operation Thereof", the entirety of which is incorporated herein by reference, a method and apparatus for calculating a predistortion polynomial is disclosed. The method and apparatus disclosed or other appropriate methods and apparatuses may be incorporated into the adaptive predistortion system APS disclosed herein. Additionally, a curve fitting method may be employed that is discussed with respect to H. Lai and Y Bar-Ness, "Minimum Distortion Power Polynomial Model (MDP-PM) of Nonlinear Power Amplifiers and Its Application to Analog Predistorters", VTC '99 Fall, Amsterdam, The Netherlands, pp. 1501–1505, September 1999, which is incorporated by reference in its entirety.

In this model, the relationship between an input signal and an output signal for any time t may be expressed by:

$$V_0(t) = V_i(t)\left\{\sum_{k=1}^{K}\alpha_{2k-1}|V_i(t)|^{2k-2}\right\} + V_e(t)$$

where $V_I(t)$ and $V_0(t)$ are the input signal and the output signal at time t, respectively, and $V_e(t)$ is an error signal. The value of k defines the order of the polynomial that is used. Typically, a value of k equal to three is sufficient, which corresponds to a 5th order (i.e., 2k–1) polynomial.

Coefficients (i.e., $\alpha_{2k-1}$) may be determined by curve fitting, using a minimum distortion power criterion of H. Lai and Y. Bar-Ness, where the power of the error signal $V_e(t)$ is minimized, and the aforementioned terms are defined as follows:

$$\alpha = \begin{bmatrix} \alpha_1 \\ \alpha_3 \\ \ldots \\ \alpha_{2K-1} \end{bmatrix}, V_i = \begin{bmatrix} V_i(t_1) \\ V_i(t_2) \\ \ldots \\ V_i(t_n) \end{bmatrix}, V_0 = \begin{bmatrix} V_0(t_1) \\ V_0(t_2) \\ \ldots \\ V_0(t_n) \end{bmatrix},$$

$$V_1 = \begin{bmatrix} V_i(t_1), V_i(t_1)|V_i(t_1)|^2 & \ldots & V_i(t_1)|V_i(t_1)|^{2K-2} \\ V_i(t_2), V_i(t_2)|V_i(t_2)|^2 & \ldots & V_i(t_2)|V_i(t_2)|^{2K-2} \\ & \ldots & \\ V_i(t_n), V_i(t_n)|V_i(t_n)|^2 & \ldots & V_i(t_n)|V_i(t_n)|^{2K-2} \end{bmatrix}$$

where n is the number of samples in the input and output signals. It may be shown that the solution:

$$\alpha = (V_1^H V_1)^{-1}(V_1^H V_0)$$

minimizes the distortion power.

The inverse of the estimated transfer function of the power amplifier PA may be derived. Typically, an iterative method can be used to solve this problem.

$$V_i^{(l)}(t) = V_0(t) \bigg/ \left\{\sum_{k=1}^{K}\alpha_{2K-1}|V_i^{(l-1)}(t)|^{2K-2}\right\} \text{ at iteration 1.}$$

The number of iterations preferable is dependent upon the slope of the amplification characteristic curve at an operating point of the power amplifier PA. For an operating point near saturation, the slope of the curve tends to flatten, which leads to a relatively large number of iterations (about six in an exemplary embodiment). If an initial value approximates the correct solution, only two or three iterations may suffice. Additionally, the initial value can be pre-calculated and stored. These calculations may be performed by a training element of the adaptive predistortion system APS.

This method can be computationally power consuming. Another approach may be used to estimate the inverse transfer function of the power amplifier PA directly employing the same curve fitting methods. One needs only to exchange the input and output in the equations discussed above. Assume the polynomial model:

$$V_i(t) = V_0(t) \bigg/ \left\{\sum_{k=1}^{K}\beta_{2K-1}|V_0(t)|^{2K-2}\right\} + V_e(t)$$

where $$\beta = \begin{bmatrix} \beta_1 \\ \beta_3 \\ \ldots \\ \beta_{2K-1} \end{bmatrix}, V_i = \begin{bmatrix} V_i(t_1) \\ V_i(t_2) \\ \ldots \\ V_i(t_n) \end{bmatrix},$$

$$V_0 = \begin{bmatrix} V_0(t_1), V_0(t_1)|V_0(t_1)|^2 \ldots V_0(t_1)|V_0(t_1)|^{2K-2} \\ V_0(t_2), V_0(t_2)|V_0(t_2)|^2 \ldots V_0(t_2)|V_0(t_2)|^{2K-2} \\ \ldots \\ V_0(t_n), V_0(t_n)|V_0(t_n)|^2 \ldots V_0(t_n)|V_0(t_n)|^{2K-2} \end{bmatrix}$$

The polynomial coefficients given by $$\beta = (V_0^H V_0)^{-1}(V_0^H V_i)$$

will minimize the power of the error signal $V_e(t)$. In this way, the training element of the adaptive predistortion system APS can directly compute the predistortion signal for a given output using the following equation:

$$V_i(t) = V_0(t) \left\{ \sum_{k=1}^{K} \beta_{2k-1} |V_0(t)|^{2k-2} \right\}$$

Accordingly, these examples are illustrative of an operation of the coefficient update subsystem CUS and the generation of the predistortion polynomial employed in the predistortion filter subsystem PFS.

Two training approaches employing algorithms described above may be used to estimate the predistortion polynomial. In one approach, the adaptive predistortion system APS uses a specially designed sequence or signal that is devised to minimize the estimation error. In the second approach, the adaptive predistortion system APS uses a transmitted signal generated during normal transceiver operation. Using the second approach, updating the predistortion coefficients can be done whenever there is a signal to be transmitted but there is not a signal to be received. Therefore, the transceiver can update the predistortion coefficients and adapt its operation to the changing characteristics of the power amplifier PA while in operation.

With further reference to FIG. 2, once the predistortion polynomial has been determined, the adaptive predistortion system APS generates the compensation signal CS in order to substantially remove distortions in subsequent transmissions. As shown in FIG. 2, the inputs to the adaptive predistortion system APS are an input signal x(t), a transmit power level Txpl, and an output signal y(t) from power amplifier PA. The predistortion coefficients are evaluated iteratively based upon the previous results. Of course, fewer or other inputs may be employed with the adaptive predistortion system ADS.

A predistortion function obtained at the $i^{th}$ iteration is denoted by the quantity $d_i(.)$, and the input signal x(t) is multiplied by the quantity $d_i(|x(t)|)$. The quantity $g_i(.)$ represents the predistortion polynomial for the combined nonlinear characteristics, or the product $$d_{i-1}(|x(t)|) f(|x(t) d_{i-1}(|x(t)|)|),$$

where $f(|x(t) d_{i-1}(|x(t)|)|)$ represents distortion characteristics of power amplifier PA dependent on input signal magnitude. At the $i^{th}$ iteration, the quantity $g_i(.)$ is obtained using the algorithm described above, and the quantity $d_i(.)$ is given by $$d_i(|x(t)|) = d_{i-1}(|g_i(|x(t)|) - x(t)|) g_i(|x(t)|)$$

and $$d_0(|x(t)|) = 1,$$

since at the $i^{th}$ iteration, the input signal x(t) is affected by both the quantity $d_{i-1}(|x(t)|)$ and the nonlinearity afforded by the power amplifier PA with negligible performance degradation, $$d_i(|x(t)|) \cong d_{i-1}(|x(t)|) g_i(|x(t)|).$$

Accordingly, after each iteration, the combined nonlinear characteristics are more linearized if the nonlinearity afforded by the power amplifier PA does not change. Using this iterative approach, better linearization of power amplifier nonlinearity is advantageously achieved than is possible with a one time application of predistortion table coefficients.

Turning now to FIG. 3, illustrated is a flow diagram of an embodiment of a method of adaptively predistorting a signal, generally designated 300, constructed in accordance with the principles of the present invention.

The method 300 starts in a step 305 with an intent of adaptively predistorting a signal that may be used with a power amplifier having a nonlinear amplification characteristic. In a first decisional step 310 and if a decision is made not to employ random transmit data, the method 300 proceeds to a second decisional step 315. If a decision is made either to employ random transmit data in the first decisional step 305 or to employ an external training sequence in the second decisional step 315, the method 300 proceeds to a third decisional step 320. If a sufficient transmit power level is ascertained in the third decisional step 320, the method 300 proceeds to a step 325. In an exemplary embodiment, a sufficient transmit power level may employ a criterion wherein a digital output signal employs at least 95 percent of the maximum available output power. Of course, other power levels may be employed as deemed appropriate.

In the step 325, a set of existing predistortion coefficients are updated with a new set of predistortion coefficients associated with an output signal of the power amplifier having the nonlinear amplification characteristic. Then in a step 330, a predistortion polynomial is utilized employing the updated set of predistortion coefficients to allow a reduction in a level of distortion. In an exemplary embodiment, the predistortion polynomial is already selected. In an alternative embodiment, the predistortion polynomial may be selected as deemed appropriate by a selection criterion. A compensation signal is generated in a step 335 employing the predistortion polynomial, and the compensation signal is combined with an input signal to create a predistortion signal in a step 340. In an exemplary embodiment, a multiplier may be employed to combine the compensation signal and the input signal. The method 300 then ends in a step 345. If a decision was not made to employ an external training sequence in the second decisional step 315 or that there was not a sufficient transmit power level in the third decisional step 320, the method 300 also ends in the step 345.

Although the present invention has been described in detail, those skilled in the art should understand that they can make various changes, substitutions and alterations herein without departing from the spirit and scope of the invention in its broadest form.

What is claimed is:

1. An adaptive predistortion system for use with a power amplifier having a nonlinear amplification characteristic, comprising:

a coefficient update subsystem coupled to an output of said power amplifier and configured to update a set of predistortion coefficients using an iterative process based on an output signal of said power amplifier; and a predistortion filter subsystem coupled to said coefficient update subsystem and configured to employ said set of predistortion coefficients to reduce a level of distortion associated with said nonlinear amplification characteristic.

2. The adaptive predistortion system as recited in claim 1 further comprising a multiplier configured to provide a predistortion signal as a function of a compensation signal from said predistortion filter subsystem.

3. The adaptive predistortion system as recited in claim 1 wherein said predistortion filter subsystem is configured to employ a predistortion polynomial to reduce said level of distortion.

4. The adaptive predistortion system as recited in claim 1 wherein said iterative process is configured to employ random transmit data to update said set of predistortion coefficients.

5. The adaptive predistortion system as recited in claim 1 wherein said iterative process is configured to employ an external training sequence to update said set of predistortion coefficients.

6. The adaptive predistortion system as recited in claim 1 wherein said predistortion filter subsystem is employable as a function of a transmit power level of said power amplifier.

7. The adaptive predistortion system as recited in claim 1 wherein said output signal of said power amplifier is an analog signal.

8. A method of adaptively predistorting a signal for use with a power amplifier having a nonlinear amplification characteristic, comprising:
   updating a set of predistortion coefficients using an iterative process based on an output signal of said power amplifier;
   employing said set of predistortion coefficients to reduce a level of distortion associated with said nonlinear amplification characteristic.

9. The method as recited in claim 8 further comprising providing a predistortion signal as a function of a compensation signal generated during said act of employing.

10. The method as recited in claim 8 wherein said employing utilizes a predistortion polynomial to reduce said level of distortion.

11. The method as recited in claim 8 wherein said updating employs random transmit data.

12. The method as recited in claim 8 wherein said updating employs an external training sequence.

13. The method as recited in claim 8 wherein said employing is a function of a transmit power level of said power amplifier.

14. The method as recited in claim 8 wherein said output signal of said power amplifier is an analog signal.

15. A transmitter, comprising:
   a feedforward section configured to receive an input signal and including a power amplifier that has a nonlinear amplification characteristic and configured to provide an output signal; and
   a feedback section configured to employ said output signal, comprising:
      an adaptive predistortion system, including:
         a coefficient update subsystem coupled to an output of said power amplifier and configured to update a set of predistortion coefficients using an iterative process based on said output signal of said power amplifier; and
         a predistortion filter subsystem coupled to said coefficient update subsystem and configured to employ said set of predistortion coefficients to reduce a level of distortion associated with said nonlinear amplification characteristic.

16. The transmitter as recited in claim 15 wherein said adaptive predistortion system further comprises a multiplier configured to provide a predistortion signal as a function of a compensation signal from said predistortion filter subsystem.

17. The transmitter as recited in claim 15 wherein said predistortion filter subsystem employs a predistortion polynomial to reduce said level of distortion.

18. The transmitter as recited in claim 15 wherein said iterative process employs random transmit data to update said set of predistortion coefficients.

19. The transmitter as recited in claim 15 wherein said iterative process employs an external training sequence to update said set of predistortion coefficients.

20. The transmitter as recited in claim 15 wherein said predistortion filter subsystem is employed as a function of a transmit power level of said power amplifier.

21. The transmitter as recited in claim 15 wherein said feedback section is a receive channel.

* * * * *